United States Patent
Kamikoriyama et al.

(10) Patent No.: US 10,518,323 B2
(45) Date of Patent: Dec. 31, 2019

(54) COPPER POWER AND METHOD FOR PRODUCING SAME

(71) Applicant: Mitsui Mining & Smelting Co., Ltd., Tokyo (JP)

(72) Inventors: Yoichi Kamikoriyama, Saitama (JP); Shigeki Nakayama, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 162 days.

(21) Appl. No.: 14/432,646

(22) PCT Filed: Jun. 20, 2013

(86) PCT No.: PCT/JP2013/066934
§ 371 (c)(1),
(2) Date: Mar. 31, 2015

(87) PCT Pub. No.: WO2014/080662
PCT Pub. Date: May 30, 2014

(65) Prior Publication Data
US 2015/0266090 A1     Sep. 24, 2015

(30) Foreign Application Priority Data
Nov. 26, 2012  (JP) .................................. 2012-257281

(51) Int. Cl.
B22F 1/00      (2006.01)
C22C 9/00      (2006.01)
(Continued)

(52) U.S. Cl.
CPC .................. *B22F 1/00* (2013.01); *B22F 3/10* (2013.01); *B22F 9/20* (2013.01); *B22F 9/24* (2013.01);
(Continued)

(58) Field of Classification Search
CPC .............. B22F 2301/10; B22F 2304/05; B22F 2304/058; B22F 9/24
(Continued)

(56) References Cited

U.S. PATENT DOCUMENTS 7,625,420 B1   12/2009 Kodas et al.
7,976,732 B2    7/2011 Kamada et al.
(Continued)

FOREIGN PATENT DOCUMENTS

CN   101064199   10/2007
CN   101072651   11/2007
(Continued)

OTHER PUBLICATIONS

Extended European Search Report—EP 13 85 6128—dated Jun. 14, 2016.
(Continued)

*Primary Examiner* — Khanh T Nguyen
(74) *Attorney, Agent, or Firm* — Young & Thompson

(57) ABSTRACT

Disclosed is copper powder having an average primary particle size D of 0.15 to 0.6 μm, having a ratio of D to $D_{BET}$, $D/D_{BET}$, of 0.8 to 4.0 wherein $D_{BET}$ is a sphere-equivalent average particle diameter calculated from a BET specific surface area, and having no layer for preventing agglomeration on the surface thereof. The copper powder is suitably produced by a method which includes a step of mixing (1) hydrazine and (2) a reactant mixture including a monovalent or divalent copper source and a liquid medium which includes water and an organic solvent having water miscibility and capable of reducing the surface tension of water, to reduce the copper source to form copper particles.

7 Claims, 1 Drawing Sheet

(51) Int. Cl.
  *B22F 9/24* (2006.01)
  *H01B 1/02* (2006.01)
  *H05K 1/09* (2006.01)
  *B22F 3/10* (2006.01)
  *B22F 9/20* (2006.01)
  *C22B 15/00* (2006.01)
  *H01B 1/22* (2006.01)
  *H01B 13/00* (2006.01)

(52) U.S. Cl.
  CPC ............ *C22B 15/0063* (2013.01); *C22C 9/00* (2013.01); *H01B 1/026* (2013.01); *H01B 1/22* (2013.01); *H01B 13/00* (2013.01); *H05K 1/097* (2013.01); *B22F 1/0018* (2013.01); *H05K 2203/1157* (2013.01); *Y10T 428/12014* (2015.01)

(58) Field of Classification Search
  USPC .......................................................... 75/373
  See application file for complete search history.

(56) References Cited

U.S. PATENT DOCUMENTS

| | | | |
|---|---|---|---|
| 2005/0097987 A1* | 5/2005 | Kodas | B22F 1/0059 75/332 |
| 2006/0098065 A1 | 5/2006 | Maruyama et al. | |
| 2008/0004358 A1 | 1/2008 | Aoki et al. | |
| 2008/0014359 A1 | 1/2008 | Kamada et al. | |
| 2008/0148904 A1 | 6/2008 | Tomonari et al. | |
| 2010/0224027 A1* | 9/2010 | Goia | B22F 9/24 75/373 |
| 2012/0170241 A1 | 7/2012 | Nakako et al. | |

FOREIGN PATENT DOCUMENTS

| | | | |
|---|---|---|---|
| CN | 101274370 A * | 10/2008 | ................ B22F 9/24 |
| CN | 101801568 | 8/2010 | |
| CN | 102549086 | 7/2012 | |
| JP | 62-99406 | 5/1987 | |
| JP | 04-116109 | 4/1992 | |
| JP | 10-317022 | 12/1998 | |
| JP | 2004-225087 | 8/2004 | |
| JP | 2004-256857 | 9/2004 | |
| JP | 2005-023417 | 1/2005 | |
| JP | 2007-254846 | 10/2007 | |
| JP | 2009-052146 | 3/2009 | |
| JP | 2009-062598 | 3/2009 | |
| JP | WO 2009038207 A1 * | 3/2009 | ............ B22F 1/0014 |
| JP | 2010-018880 | 1/2010 | |
| JP | 2010-144197 | 7/2010 | |
| JP | 2012-162807 | 8/2012 | |

OTHER PUBLICATIONS

International Search Report, PCT/JP2013/066934, dated Sep. 17, 2013.

* cited by examiner

COPPER POWER AND METHOD FOR PRODUCING SAME

TECHNICAL FIELD

This invention relates to copper powder and a method for producing the same.

BACKGROUND ART

Conventional techniques relating to wet process for producing copper powder by reducing copper ions in a liquid using a reducing agent include methods using hydrazine as a reducing agent (see Patent Literatures 1 to 3 below). Patent Literature 1 discloses a method including adding hydrazine or a hydrazine compound to a copper hydroxide slurry to form copper oxide and reducing the copper oxide to copper with hydrazine or a hydrazine compound. Patent Literature 2 proposes adjusting the pH of a copper salt aqueous solution to 12 or higher, followed by adding a reducing sugar, and followed by adding a hydrazine reducing agent. Patent Literature 3 describes a method including reducing a copper hydroxide slurry with a first reducing agent to obtain a copper suboxide slurry and reducing the copper suboxide slurry with a second reducing agent to obtain copper powder, in which hydrazine is used as a first reducing agent in combination with aqueous ammonia as a pH adjustor.

The assignee common to this patent application previously proposed another method including mixing an oily phase having a copper compound dissolved in an organic solvent and an aqueous phase having a reducing agent dissolved in water and reducing copper on the interface between the oily and the aqueous phase (see Patent Literature 4).

Patent Literature 5 describes still another method in which a reducing agent is added to a copper compound solution to produce fine copper particles by reductive precipitation, the method including (i) adding a reducing agent to a copper salt solution to produce independent monodisperse superfine copper nuclei and (ii) causing reductive precipitation of metallic copper from a copper salt solution in the presence of the superfine copper particles and a reducing agent.

Patent Literature 6 discloses a method including mixing copper (II) sulfate, ethylene glycol, and sodium hydroxide to form copper hydroxide, adding sucrose to the mixture, and heating the system to produce copper particles.

CITATION LIST

Patent Literature

Patent Literature 1: JP 62-99406A
Patent Literature 2: JP 04-116109A
Patent Literature 3: JP 2007-254846A
Patent Literature 4: JP 2009-62598A
Patent Literature 5: JP 10-317022A
Patent Literature 6: JP 2004-225087A

SUMMARY OF INVENTION

The methods according to Patent Literatures 1 to 3 are suited to produce copper powder having a primary particle size of the order of submicrons. The methods of Patent Literatures 4 to 6 are suitable to obtain copper powder in the nanometer size order called nanoparticles. An electroconductive film formed by using copper particles of submicron order size is liable to have voids between particles on account of the large particle size, and such voids contribute to an increase of electrical resistance of the conductive film. On the other hand, copper nanoparticles are difficult to use to form a conductive film because the particles shrink considerably by the heat of sintering in the film formation. In addition, nanoparticles, which are liable to agglomerate due to their large surface energy, are usually prevented from agglomeration by forming a layer of a protective agent on their surface. The existence of the protective agent causes elevation of the sintering temperature in film formation, which can lead to an energetic disadvantage.

An object of the invention is to provide copper powder and a method for producing the same that eliminate various disadvantages associated with the above mentioned conventional techniques.

The present invention provides copper powder having an average primary particle size D of 0.15 to 0.6 μm, having a ratio of D to $D_{BET}$, $D/D_{BET}$, of 0.8 to 4.0 wherein $D_{BET}$ is a sphere-equivalent average particle diameter calculated from a BET specific surface area, and having no layer for preventing agglomeration on the surface thereof.

The present invention also provides a method for producing copper powder including the step of mixing (1) hydrazine and (2) a reactant mixture comprising a monovalent or divalent copper source and a liquid medium which includes water and an organic solvent having water miscibility and capable of reducing the surface tension of water, to reduce the copper source to form copper particles.

The present invention further provides an electroconductive composition including the above-mentioned copper powder and an organic solvent.

DESCRIPTION OF EMBODIMENTS

Figure 1A:
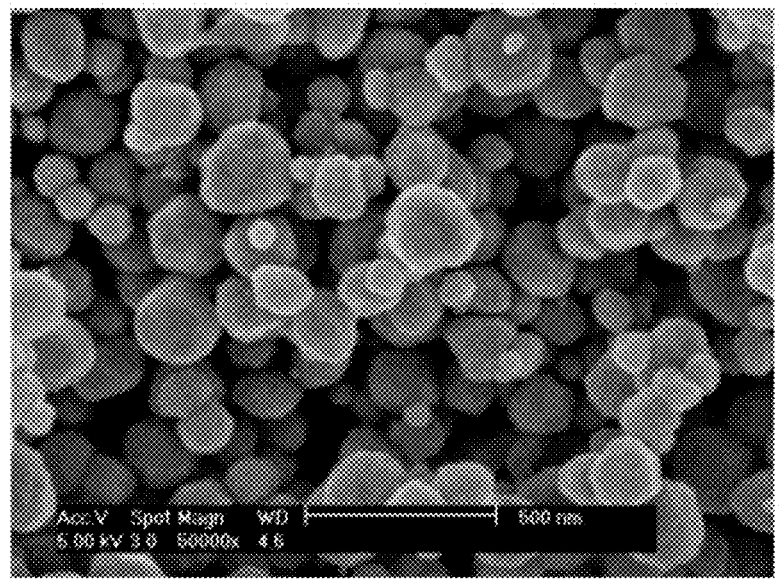
FIG. 1(a) is an electron micrograph of the copper powder obtained in Example 1.

The copper powder of the invention will be illustrated based on its preferred embodiments. As used herein, the term "copper powder" refers to either individual copper particles which are included in copper powder or copper powder which is an aggregate of copper particles, which depends on the context.

One of the characteristics of the copper powder of the invention is that it has an average primary particle size D of 0.15 to 0.6 μm, i.e., of the order of submicrons. Studies in the art have mostly been directed to copper particles of the sizes out of the above range, that is, smaller particles, particularly nanoparticles of 0.1 μm or smaller, or larger particles of the order of submicrons, with only minor studies conducted on copper particles of the order covering the above range of D. The inventor of the present invention has surprisingly found that copper particles of the above range in size which are synthesized by the method of the invention hereinafter described are less liable to agglomerate with no need to form a protective layer on their surface and that a conductive film formed from the copper particles is dense and highly conductive. The invention has been completed based on these findings.

The copper powder of the invention which has an average particle size D of 0.6 μm or smaller is easy to sinter at low temperatures in film formation and capable of forming a conductive film with reduced voids and a reduced specific resistance. The copper powder of the invention which has an average particle size D of 0.15 µm or larger is prevented from shrinking when sintered. From these considerations, the average particle size D is preferably 0.15 to 0.6 µm, more preferably 0.15 to 0.4 µm. The term "average primary particle size D" as used for the copper powder of the invention refers to a sphere-equivalent volume average particle size calculated from Feret's diameters of a plurality of particles measured on an image of a scanning electron microscope. The detailed method of measurement will be described in Examples given later. The copper particles of the invention are preferably spherical in terms of dispersibility.

The copper powder of the invention does not have a layer for preventing agglomeration (hereinafter also referred to as a protective layer) on the surface thereof. For the copper powder of the invention to have an average particle size D in the above specified range and to have no protective layer on the surface thereof are believed to be largely contributory to their satisfactory low-temperature sinterability. It has been a practice to form a protective layer by treating copper powder with a surface treating agent in the post-treatment after the production of copper powder for the purpose of, for example, improving the dispersibility of the copper powder. Examples of such a surface treating agent include various organic compounds, including fatty acids such as stearic acid, lauric acid, and oleic acid, and coupling agents containing a semi-metal or a metal, e.g., silicon, titanium, or zirconium. Even when a surface treating agent is not used in the post-treatment after the production of copper powder, a protective layer may be formed by a dispersant that is added to a reactant mixture containing a copper source in the manufacture of copper powder by a wet reduction process. Examples of such a dispersant include organic compounds, such as a phosphate, e.g., sodium pyrophosphate, or gum arabic.

In order to ensure the improvement in low-temperature sinterability of the copper powder, the copper powder of the invention is preferably as free as possible from the elements that can form the above discussed protective layer. Specifically, the total content of carbon, phosphorus, silicon, titanium, and zirconium that have been present in conventional copper powders as protective layer-forming elements is preferably 0.10 mass % or less, more preferably 0.08 mass % or less, even more preferably 0.06 mass %, relative to the copper powder. According to the inventor's estimation, in the case of forming a protective layer, which covers the surface of a copper particle having a size of 0.6 µm, by using lauric acid as a surface treating agent, the content of, e.g., carbon in the copper particle is 0.13 mass % or more.

Although the smaller the total content of the above described elements, the better the results, sufficient improvement on low-temperature sinterability will be secured when the total content is as low as about 0.06 mass %. If the carbon content of the copper powder is excessively high, sintering the copper powder to form a conductive film may be accompanied by evolution of carbon-containing gas, which can cause cracking in the resulting film or separation of the film from the substrate. Such inconveniences resulting from carbon-containing gas evolution will be prevented when the above total content in the copper powder is low enough.

While the above described total content is a total of carbon, phosphorus, silicon, titanium, and zirconium, preferred contents of the individual elements are as follows: the content of carbon is 0 mass % to 0.08 mass %, more preferably 0 mass % to 0.05 mass %; the content of phosphorus is 0 mass % to 0.001 mass %, more preferably 0 mass % to 0.0001 mass %; the content of silicon is 0 mass % to 0.005 mass %, more preferably 0 mass % to 0.001 mass %; the content of titanium is 0 mass % to 0.001 mass %, more preferably 0 mass % to 0.0001 mass %; and the content of zirconium is 0 mass % to 0.001 mass %, more preferably 0 mass % to 0.0001 mass %.

For use as a material for circuits of electron devices, the copper powder of the invention preferably has minimized contents of impurity elements as well as the aforementioned elements. Such impurity elements are typified by sodium, sulfur, and chlorine. These elements, which originate in the reducing agent, copper source, and the like used in the manufacture of copper powder, are likely to be unavoidably incorporated into copper powder. It is preferred that the total content of these three elements in the copper powder of the invention be 0.10 mass % or less, more preferably 0.02 mass % or less, even more preferably 0.015 mass % or less. Although the smaller the total content of the three elements, the better the results, copper powder with satisfactory characteristics will be obtained by setting the lower limit of the total content at about 0.0015 mass %. Examples of the impurity elements additionally include potassium and iron.

While the above described content of impurity elements is a total of sodium, sulfur, and chlorine, preferred contents of the individual impurity elements are as follows: the content of sodium is 0 mass % to 0.001 mass %, more preferably 0 mass % to 0.0001 mass %; the content of sulfur is 0 mass % to 0.02 mass %, more preferably 0 mass % to 0.01 mass %; and the content of chlorine is 0 mass % to 0.005 mass %, more preferably 0 mass % to 0.0005 mass %; the content of potassium is preferably 0 mass % to 0.001 mass %, more preferably 0 mass % to 0.0001 mass %; and the content of iron is preferably 0 mass % to 0.001 mass %, more preferably 0 mass % to 0.0001 mass %.

As discussed above, the copper powder of the invention has a small impurity content and a high copper purity. Specifically, the copper purity of the copper powder of the invention is preferably 98 mass % or more, more preferably 99 mass % or more, even more preferably 99.8 mass % or more. The contents of the individual elements hereinabove described are measured by the method described in Examples given infra.

As stated earlier, the copper powder of the invention is hardly agglomerated notwithstanding the absence of a layer for preventing agglomeration of primary particles. The degree of agglomeration of primary particles may be evaluated in terms of a ratio of average primary particle size D to average particle size $D_{BET}$, $D/D_{BET}$, wherein $D_{BET}$ is a sphere-equivalent average particle diameter calculated from the BET specific surface area. The copper powder of the invention has a $D/D_{BET}$ of 0.8 to 4.0. The $D/D_{BET}$ value is a measure showing how broad the particle size distribution of the copper powder is as compared with an ideal monodisperse distribution system of non-agglomerated copper particles with a uniform particle size. The $D/D_{BET}$ value is used to estimate the degree of agglomeration.

Evaluation of a $D/D_{BET}$ is basically based on the premise that the copper particles have little surface porosity and are homogeneous and also have a continuous distribution (unimodal distribution). Under this premise, when a $D/D_{BET}$ is 1, the copper powder is interpreted as having the above described ideal monodisperse size distribution. As the $D/D_{BET}$ increases away from 1, the copper powder is presumed to have a broader particle size distribution with non-uniform particle sizes or to have a higher degree of agglomeration. A $D/D_{BET}$ rarely takes on a value below 1, which case is mostly observed with copper powders that do not meet the above premise, such as copper powder having pores on the surface, copper powder with non-uniform surface, and copper powder having local agglomeration.

The $D/D_{BET}$ is preferably 0.8 to 4.0, more preferably 0.9 to 1.8, in order to minimize agglomeration of primary particles. A $D_{BET}$ is obtained by measuring the BET specific surface area of the copper powder by the gas adsorption method. Specifically, a BET specific surface area and a $D_{BET}$ are obtained by the methods described in Examples given infra.

While the $D/D_{BET}$ of the copper powder of the invention is in the above range, the value $D_{BET}$ is preferably 0.08 μm to 0.6 μm, more preferably 0.1 μm to 0.4 μm, even more preferably 0.2 μm to 0.4 μm, and the BET specific surface area of the copper powder of the invention is preferably 1.7 $m^2/g$ to 8.5 $m^2/g$, more preferably 2.5 $m^2/g$ to 4 $m^2/g$.

The copper powder of the invention preferably has a crystallite size of 60 nm or smaller, more preferably 50 nm or smaller, even more preferably 40 nm or smaller, the lower limit of the crystallite size of the copper powder is preferably 20 nm. With the crystallite size falling within that range, the copper powder exhibits further improved low-temperature sinterability. The crystallite size of copper powder can be measured by the method described in Examples hereinafter given.

The copper powder of the invention is sinterable at low temperatures. Specifically, the sintering onset temperature is preferably 170° C. to 240° C., more preferably 170° C. to 235° C., even more preferably 170° C. to 230° C. Copper powder of which the sintering onset temperature is in the above range is suitably used as a wiring material for a flexible substrate including polyimide because polyimide generally used to make a flexible substrate has a glass transition point higher than 240° C.

Figure 1B:
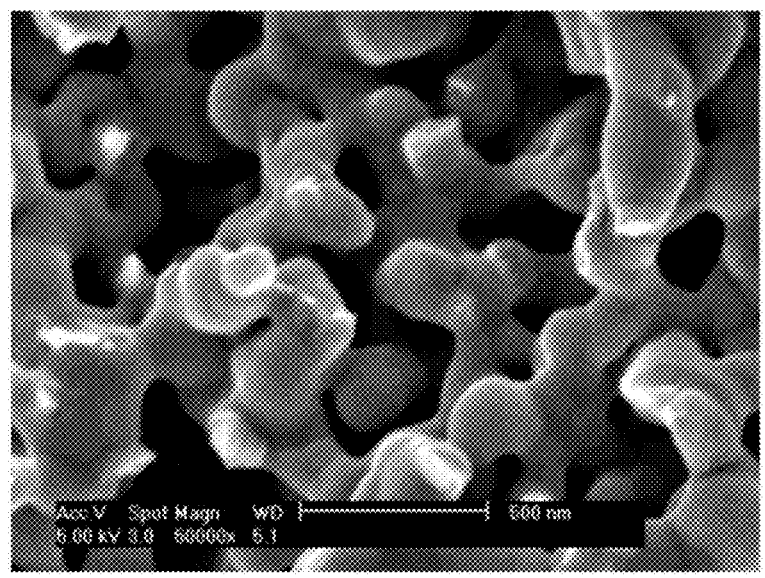
FIG. 1(b) is an electron micrograph of the conductive film obtained in Example 14.

The sintering onset temperature is measured by allowing copper powder to stand in a furnace having a nitrogen atmosphere containing 3 vol % hydrogen (hereinafter "3 vol % $H_2$—$N_2$ atmosphere") and gradually increasing temperature in the furnace. The method of measurement will be described more concretely in Examples hereinafter set forth. Whether sintering has started is judged by observing the copper powder taken out of the furnace under a scanning electron microscope to see if surface association has occurred between particles. Surface association is a process in which particles are united together with the surface of a particle continuing to the surface of another particle. For instance, the SEM image of a conductive film displayed in FIG. 1(b) shows that surface association among particles has occurred.

A preferred method for producing the copper powder of the invention will then be described. This method is based on wet reduction of copper ions using hydrazine as a reducing agent and characterized by using, as a solvent, an organic solvent having water miscibility and capable of reducing the surface tension of water. The use of such a specific organic solvent in the wet reduction process makes it easier and simpler to produce the copper powder of the invention.

The method of the invention includes the step of mixing (1) hydrazine and (2) a reactant mixture containing a monovalent or divalent copper source and a liquid medium which includes water and the above specified organic solvent, to reduce the copper source to form copper particles. In the method of the invention, an operation for positively forming a protective layer is not conducted.

Examples of the organic solvent include monohydric alcohols, polyhydric alcohols, polyhydric alcohol esters, ketones, and ethers. The monohydric alcohols preferably have 1 to 5 carbon atoms, more preferably 1 to 4 carbon atoms, including methanol, ethanol, n-propanol, isopropanol, and t-butanol.

Examples of the polyhydric alcohols include diols, such as ethylene glycol, 1,2-propylene glycol, and 1,3-propylene glycol, and triols, such as glycerol.

Examples of the polyhydric alcohol esters include fatty acid esters of the above described polyhydric alcohols. The fatty acid is preferably a monofunctional fatty acid having 1 to 8 carbon atoms, more preferably 1 to 5 carbon atoms. The polyhydric alcohol esters preferably contain at least one hydroxyl group.

Preferred ketones include those having 1 to 6 carbon atoms, more preferably 1 to 4 carbon atoms, in the alkyl moiety bonded to the carbonyl group, such as methyl ethyl ketone and acetone.

Examples of the ethers include dimethyl ether, ethyl methyl ether, diethyl ether; cyclic ethers, such as oxetane, tetrahydrofuran, and tetrahydropyran; and polymeric compounds, such as polyethylene glycol and polypropylene glycol.

Of the organic solvents recited above monohydric alcohols are preferred in terms of economic efficiency and safety.

The mass ratio of the organic solvent to water of the liquid medium (organic solvent/water) is preferably 1/99 to 90/10, more preferably 1.5/98.5 to 90/10. When the organic solvent to water mass ratio is in that range, the surface tension of water during wet reduction reaction is decreased moderately, and copper powder having the D and $D/D_{BET}$ of the above described respective ranges is obtained easily.

The liquid medium preferably includes only water and the organic solvent. This is preferred for the production of copper powder having little impurity and no protective layer without using a dispersant or a like component.

In the practice of the method of the invention, a copper source is dissolved or dispersed in the above described liquid medium to prepare a reactant mixture. Specifically, the reactant mixture may be prepared by, for example, mixing the liquid medium and the copper source and stirring the mixture. The amount of the liquid medium to be mixed is preferably 4 g to 2000 g, more preferably 8 g to 1000 g, per gram of the copper source. The above range of the copper to liquid medium ratio is preferred in terms of high productivity in copper powder synthesis.

The copper source may be chosen from various compounds of monovalent or divalent copper. In particular, copper acetate, copper hydroxide, copper sulfate, copper oxide, and copper suboxide are preferred for the ease of production of copper powder having the D and $D/D_{BET}$ falling within the above respective ranges and copper powder with reduced impurity.

The reactant mixture is then mixed with hydrazine. The amount of hydrazine to be added is preferably 0.5 to 50 mols, more preferably 1 to 20 mols, per mole of copper. That range is preferred for the ease of production of copper powder having the D and $D/D_{BET}$ falling in their respective ranges recited. For the same reason, the temperature of the reaction system is preferably maintained at 40° C. to 90° C., more preferably 50° C. to 80° C., from the beginning to end of mixing. For the same reason, it is preferred to continue the stirring from the beginning of mixing to the end of the reaction.

The mixing of the reactant mixture and hydrazine is preferably carried out by the procedure (a) or (b) below. By adopting either one of them, inconveniences that might occur due to abrupt reaction are effectively prevented from occurring.

(a) Hydrazine is put into the reactant mixture in a plurality of portions at a time interval.
(b) Hydrazine is put into the reactant mixture continuously over a predetermined period of time.

In the case of (a), the plurality of portions is preferably 2 to about 6 portions, and the interval between the portions is preferably about 5 to 90 minutes.

In the case of (b), the predetermined period of time is preferably about 1 to 180 minutes. It is preferred to continue stirring the reaction mixture after completion of the mixing to allow the reaction product to age, whereby copper powder with the $D/D_{BET}$ of the above range is obtained more easily.

In the method of the invention, it is preferred to use only hydrazine as a reducing agent to obtain copper powder with reduced impurity more easily.

After washing by decantation or otherwise, the resulting copper powder of the present invention may be dispersed in water, an organic solvent, or a like medium to make a slurry or may be dried to a dry powder form. The copper powder of the invention may be compounded with a solvent, a resin, and so on to make an electroconductive composition, such as ink or paste, as will be described later.

Conventional copper powders having no protective layer and particle sizes of the order of submicrons are difficult to collect in the form of dry powder because of the liability to agglomerate on drying. Therefore, in order to be stored or transported, the conventional copper powders have been formulated into an aqueous slurry or paste by adding thereto water, an organic solvent, a resin, and the like. In contrast to this, the copper powder of the invention is permitted to be stored or transported in a dry powder form because of its unlikelihood of agglomeration notwithstanding the absence of a protective layer. This offers advantages such as storage space saving and ease of transportation.

The electroconductive composition containing the copper powder of the invention includes at least the copper powder and an organic solvent. As the organic solvent, any of those conventionally used in the technical field of metal powder-containing conductive compositions may be used with no particular limitation. Examples of suitable organic solvents include monohydric alcohols, polyhydric alcohols, polyhydric alcohol alkyl ethers, polyhydric alcohol aryl ethers, esters, nitrogen-containing heterocyclic compounds, amides, amines, and saturated hydrocarbons. These organic solvents may be used either individually or in combination of two or more thereof.

Examples of the monohydric alcohols include 1-propanol, 1-butanol, 1-pentanol, 1-hexanol, cyclohexanol, 1-heptanol, 1-octanol, 1-nonanol, 1-decanol, glycidol, benzyl alcohol, methylcyclohexanol, 2-methyl-1-butanol, 3-methyl-2-butanol, 4-methyl-2-pentanol, isopropyl alcohol, 2-ethylbutanol, 2-ethylhexanol, 2-octanol, 2-methoxyethanol, 2-ethoxyethanol, 2-n-butoxyethanol, and 2-phenoxyethanol.

Examples of the polyhydric alcohols include ethylene glycol, propylene glycol, 1,3-propanediol, 1,4-butanediol, 1,5-pentanediol, diethylene glycol, dipropylene glycol, triethylene glycol, and tetraethylene glycol.

Examples of the polyhydric alcohol alkyl ethers include ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol monomethyl ether, triethylene glycol monoethyl ether, and propylene glycol monobutyl ether.

Examples of the polyhydric alcohol aryl ethers include ethylene glycol monophenyl ether. Examples of the esters include ethyl cellosolve acetate, butyl cellosolve acetate, and γ-butyrolactone. Examples of the nitrogen-containing heterocyclic compounds are N-methylpyrrolidone and 1,3-dimethyl-2-imidazolidinone. Examples of the amides are formamide, N-methylformamide, and N,N-dimethylformamide. Examples of the amines include monoethanolamine, diethanolamine, triethanolamine, tripropylamine, and tributylamine.

Examples of the saturated hydrocarbons include heptane, octane, nonane, decane, undecane, dodecane, tridecane, tetradecane, pentadecane, and hexadecane.

Where needed, the electroconductive composition of the invention may contain a dispersant. The dispersant is preferably a nonionic surfactant free from sodium, calcium, phosphorus, sulfur, and chlorine. Examples of such nonionic surfactants include polyhydric alcohol fatty acid esters, propylene glycol fatty acid esters, glycerol fatty acid esters, polyglycerol fatty acid esters, polyoxyethylene glycerol fatty acid esters, polyoxyethylene alkyl ethers, polyoxyethylene polyoxypropylene alkyl ethers, polyoxyalkylene alkyl ethers, sorbitan fatty acid esters, polyoxyethylene sorbitan fatty acid esters, polyoxyethylene sorbitol fatty acid esters, polyoxyethylene hydrogenated castor oil, polyoxyethylene alkylamines, polyoxyalkylene alkylamines, alkylalkanolamides, and polyoxyethylene alkyl phenyl ethers.

The electroconductive composition of the invention may further contain an organic vehicle or a glass frit. The organic vehicle comprises a resin component and a solvent. Examples of the resin component are acrylic resins, epoxy resins, ethyl cellulose, and carboxyethyl cellulose. Examples of the solvent include terpene solvents, such as terpineol and dihydroterpineol, and ether solvents, such as ethyl carbitol and butyl carbitol. Examples of the glass frit include borosilicate glass, barium borosilicate glass, and zinc borosilicate glass.

If desired, the electroconductive composition of the invention may further contain copper powder other than that of the invention in order to improve various performance properties of the conductive composition.

The compounding ratios of the copper powder and the organic solvent may be adjusted in a broad range according to the intended use of the electroconductive composition or the method of applying the electroconductive composition. Suitable methods of application include inkjet printing, dispenser printing, microdispenser printing, gravure printing, screen printing, dip coating, spin coating, spray coating, bar coating, and roller coating.

The electroconductive composition of the invention may have a range of viscosity depending on the copper powder content and is called ink, slurry, paste, and so on according to the viscosity. The copper powder content of the electroconductive composition of the invention may widely range from 5 mass % to 95 mass %. When an inkjet printing is selected as a coating technique, the copper powder content of the electroconductive composition is preferably 10 mass % to 50 mass %. The copper powder content of the electroconductive composition suitable for screen printing is 60 mass % to 95 mass %. The copper powder content of the electroconductive composition suited for coating using an applicator is 5 mass % to 90 mass %. When the copper powder content is high, like about 90 mass %, the electroconductive composition is suitably applied by dispenser printing.

The electroconductive composition of the invention is applied to a substrate to form a coating film, which is then sintered to provide a conductive film. The conductive film is suited to form circuits of printed wiring boards or to secure electrical connection for an external electrode of a ceramic capacitor. The substrate to be used is selected, according to the type of electronic circuits using the copper powder, from printed wiring boards made of glass epoxy resins and flexible printed wiring boards made of polyimides, and the like.

The temperature of sintering the coating film is at or above the above described sintering onset temperature of the copper powder. The sintering temperature may be, for example, 170 to 240° C. The sintering atmosphere may be a non-oxidative atmosphere. The non-oxidative atmosphere may be, for example, a reductive atmosphere such as hydrogen or carbon monoxide; a weakly reductive atmosphere such as hydrogen-nitrogen mixed atmosphere; or an inert atmosphere such as argon, neon, helium, or nitrogen. Whichever of the reductive, weakly reductive, and inert atmosphere is chosen, it is advisable that the heating furnace be once evacuated to remove oxygen and then a desired atmosphere be introduced into the furnace prior to heating. In the case when sintering is performed in a hydrogen-nitrogen mixed atmosphere, the hydrogen concentration is preferably at or below an explosion limit, specifically from about 1 vol % to 4 vol %. Whichever atmosphere is chosen, the sintering time is preferably 10 minutes to 3 hours, more preferably 30 minutes to 2 hours.

The thus formed conductive film exhibits high electroconductivity attributed to the copper powder of the invention used as a constituent component of the electroconductive composition. The conductive film also achieves high adhesion to a substrate on which it is formed because, the inventor believes, the copper powder of the invention has good low-temperature sinterability. In detail, in the step of sintering the coating film containing the copper powder of the invention, the copper particles having good low-temperature sinterability easily melt to undergo surface association with one another to attain increased conductivity. If, in contrast, the particles have poor low-temperature sinterability, it is not easy to achieve high conductivity by the sintering due to mere point contact among the particles. With regard to the adhesion, it is considered that increased adhesion is obtained because, for one thing, the particles melt in the sintering step to have an increased contact area with the substrate surface and, for another, an anchoring effect is generated between the molten particles and the substrate surface.

EXAMPLES

The invention will now be illustrated in greater detail with reference to Examples, but it should be understood that the invention is not deemed to be limited thereto. Unless otherwise noted, all the percents are given by mass.

Example 1

A 500 ml round bottom flask was provided with a stirring blade, and 15.71 g of copper acetate monohydrate was put therein as a copper source. Ten grams of water and 70.65 g of isopropanol as an organic solvent were further put therein to prepare a reactant mixture. The reactant mixture was heated up to 60° C. while stirring at 150 rpm. While continuing stirring, 1.97 g of hydrazine monohydrate was added to the reactant mixture at a time, followed by stirring for 30 minutes. Then, 17.73 g of hydrazine monohydrate was added the reactant mixture, followed by stirring for 30 minutes. Finally, 7.88 g of hydrazine monohydrate was added the reactant mixture, followed by stirring for 1 hour while maintaining the mixture at 60° C. After completion of the reaction, the whole reaction mixture was separated into solid and liquid. The thus collected solid was repeatedly washed by decantation using pure water until the conductivity of the supernatant liquor decreased to 1000 μS/cm or less. The washed product was separated into solid and liquid. To the solid was added 160 g of ethanol, and the mixture was filtered using a press filter. The filter cake was dried under reduced pressure at ambient temperature to give copper powder.

Examples 2 to 13

Copper powder was obtained in the same manner as in Example 1, except for changing the organic solvent, the amounts of water and the organic solvent, or the copper source as shown in Table 1 below.

Comparative Examples 1 and 2

Commercially available copper powder having a protective layer "CT500" available from Mitsui Mining & Smelting Co., Ltd. was used as Comparative Example 1. Commercially available copper powder having a protective layer "1050Y" available from Mitsui Mining & Smelting Co., Ltd. was used as Comparative Example 2.

Measurement and Evaluation:

Each of the copper powders obtained in examples 1 through 13 and the copper powders of Comparative Examples 1 and 2 was evaluated in terms of average primary particle size D (μm), BET specific surface area (m²/g), and average sphere-equivalent particle size based on BET specific surface area $D_{BET}$ (m) by the methods described below. Further, $D/D_{BET}$ was calculated from the D and the $D_{BET}$ obtained. The contents (mass %) of carbon, phosphorus, silicon, titanium, and zirconium were measured by the method described below to obtain a total content of these five elements. The contents (mass %) of sodium, sulfur, and chlorine were measured to obtain a total content of these three elements. The contents (mass %) of potassium, iron, nitrogen, and copper were also measured. The crystallite size (nm) was obtained by the method described infra. The sintering onset temperature (° C.) was determined by the method described below. The results obtained are shown in Table 1, except that the contents of the elements except copper are shown in Table 2.

(1) Average Primary Particle Size D

The copper powder was observed under a scanning electron microscope XL30SFEG available from FEI Company Japan Ltd. at magnifications of 10,000 or 30,000 times, and the horizontal Feret's diameter of 200 particles in the field of view was measured. A sphere-equivalent volume average particle size was calculated from the measured values to give an average primary particle size D (μm).

(2) BET Specific Surface Area

The BET specific surface area was measured using Flow-Sorb II 2300 available from Shimadz Corp. by the one-point BET method. The weight of the sample was 1.0 g. The sample was preliminarily degassed at 150° C. for 15 minutes.

(3) Sphere-Equivalent Average Particle Diameter Based on BET Specific Surface Area $D_{BET}$ The $D_{BET}$ was calculated from the BET specific surface area (SSA) obtained above and the density of the copper in the vicinity of room temperature (8.94 g/cm³) according to the formula:

$$D_{BET}(\mu m)=6/(SSA(m^2/g)\times 8.94(g/cm^3))$$

(4) Elemental Contents

The carbon and sulfur contents (mass %) were determined using a gas analyzer EMIA-920V available from Horiba, Ltd. The phosphorus, silicon, titanium, zirconium, sodium, potassium, and iron contents (mass %) were measured using an ICP emission spectrometer ICP-SPS-3000 available from SII NanoTechnology Inc. The chlorine content (mass %) was measured using an ion chromatograph AQF-2100F available from Mitsubishi Chemical Analytech Co., Ltd. The copper content (mass %) was obtained by subtracting the amount of the impurities from 100%.

(5) Crystallite Size

The copper powder was analyzed by X-ray diffractometry using RINTO-TTRIII available from Rigaku Corp., and the crystallite size (nm) was calculated using the (111) plane peak width by the Scherrer method.

(6) Sintering Onset Temperature

The copper powder was placed in an aluminum vessel and maintained in a furnace in a 3 vol % $H_2$—$N_2$ atmosphere at 160° C. for 1 hour. The powder was taken out from the furnace and observed under the same scanning electron microscope as used above at magnifications of 50,000 times to see if surface association had occurred. When surface association was not observed, the furnace temperature was reset at a temperature 10° C. higher than the initially set temperature and again sintered in the same manner to examine the occurrence of surface association. The sintering was repeated at a thus elevated temperature until surface association was observed. The temperature of the furnace at which surface association was observed was taken as a sintering onset temperature (° C.).

TABLE 1

| | Production Conditions | | | | Characteristics of Copper Powder | | | | | | | |
|---|---|---|---|---|---|---|---|---|---|---|---|---|
| | Organic Solvent | Organic Solvent (g)/ Water (g) | Copper Source | Protective Layer | D (μm) | BET SSA ($m^2$/g) | $D_{BET}$ (μm) | $D/D_{BET}$ | Total of C, P, Si, Ti, & Zr (mass %) | Total of Na, Cl, & S (mass %) | Cu (mass %) | Crystallite Size (nm) | Sintering Onset Temp. (° C.) |
| Ex. 1 | isopropanol | 70.65/10.00 | copper acetate monohydrate | no | 0.19 | 3.91 | 0.17 | 1.1 | 0.05 | <0.0011 | >99.8 | 35 | 170 |
| Ex. 2 | isopropanol | 39.24/50.0 | copper acetate monohydrate | no | 0.24 | 3.17 | 0.21 | 1.2 | 0.04 | <0.0011 | >99.8 | 35 | 170 |
| Ex. 3 | isopropanol | 7.85/90.00 | copper acetate monohydrate | no | 0.22 | 2.88 | 0.23 | 0.9 | 0.05 | <0.0011 | >99.8 | 37 | 180 |
| Ex. 4 | methanol | 39.58/50.00 | copper acetate monohydrate | no | 0.28 | 3.18 | 0.21 | 1.3 | 0.04 | <0.0011 | >99.8 | 38 | 170 |
| Ex. 5 | ethanol | 39.53/50.00 | copper acetate monohydrate | no | 0.27 | 3.20 | 0.21 | 1.3 | 0.04 | <0.0011 | >99.8 | 39 | 170 |
| Ex. 6 | n-propanol | 40.73/50.00 | copper acetate monohydrate | no | 0.26 | 3.02 | 0.22 | 1.2 | 0.04 | <0.0011 | >99.8 | 39 | 170 |
| Ex. 7 | t-butanol | 40.35/50.00 | copper acetate monohydrate | no | 0.27 | 2.84 | 0.24 | 1.1 | 0.04 | <0.0011 | >99.8 | 40 | 170 |
| Ex. 8 | isopropanol | 70.65/10.00 | copper hydroxide | no | 0.15 | 8.27 | 0.08 | 1.8 | 0.05 | <0.0011 | >99.8 | 27 | 170 |
| Ex. 9 | isopropanol | 70.65/10.00 | copper oxide | no | 0.50 | 4.94 | 0.14 | 3.7 | 0.05 | <0.0011 | >99.8 | 36 | 170 |
| Ex. 10 | isopropanol | 70.65/10.00 | copper sulfate pentahydrate | no | 0.33 | 2.50 | 0.27 | 1.2 | 0.05 | <0.0106 | >99.8 | 42 | 170 |
| Ex. 11 | isopropanol | 74.58/5.00 | copper acetate monohydrate | no | 0.17 | 3.92 | 0.17 | 1.0 | 0.04 | <0.0011 | >99.8 | 35 | 170 |
| Ex. 12 | isopropanol | 1.57/98.00 | copper acetate monohydrate | no | 0.40 | 1.77 | 0.38 | 1.1 | 0.04 | <0.0011 | >99.8 | 53 | 180 |
| Ex. 13 | isopropanol | 3.93/95.00 | copper acetate monohydrate | no | 0.36 | 1.80 | 0.37 | 1.0 | 0.04 | <0.0011 | >99.8 | 49 | 180 |
| Com. Ex. 1 | | CT500 | | yes | 0.67 | 1.23 | 0.55 | 1.2 | 0.23 | 0.0189 | 99.4 | 41 | >290 |
| Comp. Ex. 2 | | 1050Y | | yes | 0.94 | 1.13 | 0.59 | 1.6 | 0.16 | <0.0032 | 99.4 | 93 | >290 |

TABLE 2

| | Elemental Contents (mass %) | | | | | | | | | |
|---|---|---|---|---|---|---|---|---|---|---|
| | C | P | Si | Ti | Zr | Na | K | Fe | Cl | S |
| Example 1 | 0.05 | <0.0001 | 0.0007 | <0.0001 | <0.0001 | <0.0001 | <0.0001 | 0.0001 | <0.0005 | <0.0005 |
| Example 2 | 0.04 | <0.0001 | 0.0004 | <0.0001 | <0.0001 | <0.0001 | <0.0001 | 0.0001 | <0.0005 | <0.0005 |
| Example 3 | 0.05 | <0.0001 | 0.0007 | <0.0001 | <0.0001 | <0.0001 | <0.0001 | 0.0001 | <0.0005 | <0.0005 |
| Example 4 | 0.04 | <0.0001 | 0.0004 | <0.0001 | <0.0001 | <0.0001 | <0.0001 | 0.0001 | <0.0005 | <0.0005 |
| Example 5 | 0.04 | <0.0001 | 0.0004 | <0.0001 | <0.0001 | <0.0001 | <0.0001 | 0.0001 | <0.0005 | <0.0005 |
| Example 6 | 0.04 | <0.0001 | 0.0004 | <0.0001 | <0.0001 | <0.0001 | <0.0001 | 0.0001 | <0.0005 | <0.0005 |
| Example 7 | 0.04 | <0.0001 | 0.0004 | <0.0001 | <0.0001 | <0.0001 | <0.0001 | 0.0001 | <0.0005 | <0.0005 |
| Example 8 | 0.05 | <0.0001 | 0.0007 | <0.0001 | <0.0001 | <0.0001 | <0.0001 | 0.0001 | <0.0005 | <0.0005 |
| Example 9 | 0.05 | <0.0001 | 0.0007 | <0.0001 | <0.0001 | <0.0001 | <0.0001 | 0.0001 | <0.0005 | <0.0005 |
| Example 10 | 0.05 | <0.0001 | 0.0007 | <0.0001 | <0.0001 | <0.0001 | <0.0001 | 0.0001 | <0.0005 | 0.01 |
| Example 11 | 0.04 | <0.0001 | 0.0004 | <0.0001 | <0.0001 | <0.0001 | <0.0001 | 0.0001 | <0.0005 | <0.0005 |
| Example 12 | 0.04 | <0.0001 | 0.0004 | <0.0001 | <0.0001 | <0.0001 | <0.0001 | 0.0001 | <0.0005 | <0.0005 |
| Example 13 | 0.04 | <0.0001 | 0.0004 | <0.0001 | <0.0001 | <0.0001 | <0.0001 | 0.0001 | <0.0005 | <0.0005 |
| Comparative Example 1 | 0.22 | 0.01 | 0.0004 | <0.0001 | <0.0001 | 0.0009 | <0.0001 | 0.0001 | 0.015 | 0.003 |
| Comparative Example 2 | 0.16 | <0.0001 | <0.0002 | <0.0001 | <0.0001 | 0.0022 | <0.0001 | 0.0014 | <0.0005 | <0.0005 |

As is apparent from the results shown in Table 1, the copper powder of each Example has a lower sintering onset temperature, proving to have better low-temperature sinterability. As is understood from the specific resistance of the conductive film of Example 14 and the electron micrograph of FIG. 1(b), the copper powder of the invention is sintered at or below 230° C. to provide a conductive film with low specific resistance.

Example 14

Preparation of Conductive Composition and Formation of Conductive Film

The copper powder obtained in Example 1 was formulated into a slurry (conductive composition) in a concentration of 40 mass %.

Specifically, 4 g of the copper powder and 6 g of tetraethylene glycol were mixed using a three-roll mill to prepare a slurry. The slurry was applied onto a glass substrate using an applicator to obtain a coating film, and the resulting coating film was heat treated at 230° C. for 2 hours in a 3 vol % $H_2$—$N_2$ atmosphere to form a 12 μm thick conductive film.

The copper powder obtained in Example 1 and the conductive film obtained in Example 14 were observed using the same scanning electron microscope as used above at magnifications of 50,000 times. The microscopic image of the copper powder is shown in FIG. 1(a), and the microscopic image of the conductive film is shown in FIG. 1(b). The surface resistivity of the conductive film was measured with a resistivity meter MCP-T600 available from Mitsubishi Chemical Corp., and the surface resistivity was divided by the thickness to give a specific resistance of 6 μΩ·cm, which was close to the specific resistance of bulk copper (1.7 μΩ·cm).

Example 15

Preparation of Conductive Composition and Formation of Conductive Film

A conductive ink (conductive composition) was prepared from 92 mass % the copper powder obtained in Example 4, 6 mass % tetraethylene glycol, and 2 mass % polyoxyethylene alkyl ether (Trion X-100). The resulting conductive ink was applied to a polyimide film Upilex 25S available from Ube Industries, Ltd. by screen printing to obtain a coating film, and the resulting coating film was heat treated at 230° C. for 2 hours in a 3 vol % $H_2$—$N_2$ atmosphere to form a 34 μm thick conductive film. A strip of adhesive cellophane tape was applied to the conductive film, and a peel test was conducted to find no peel. The specific resistance of the conductive film was measured in the same manner as in Example 14 and was found to be 9 μΩ·cm.

Comparative Example 3

Preparation of Conductive Composition and Formation of Conductive Film

A conductive ink was prepared in the same manner as in Example 15, except for replacing the copper powder of Example 4 by copper powder CT500 available from Mitsui Mining & Smelting (particle size: 0.67 μm). A conductive film was formed in the same manner as in Example 15, except for using the resulting conductive ink. When the resulting conductive film was subjected to the same peel test as in Example 15, peel of the conductive film from the polyimide film was observed. The specific resistance of the conductive film was found to be 45 μΩ·cm.

INDUSTRIAL APPLICABILITY

The invention provides copper powder having good low-temperature sinterability and a method for producing the same. The invention also provides copper powder capable of forming a conductive film having low specific resistance and high adhesion to a substrate and a method for producing the same.

The invention claimed is:

1. Copper powder having a crystallite size of 37 nm or smaller, an average primary particle size D of 0.15 to 0.6 μm, having a ratio of D to $D_{BET}$ ($D/D_{BET}$) of 0.8 to 4.0, wherein $D_{BET}$ is a sphere-equivalent average particle diameter calculated from a BET specific surface area, and having no layer for preventing agglomeration on the surface thereof.

2. The copper powder according to claim 1, having a total content of carbon, phosphorus, silicon, titanium, and zirconium of 0.10 mass % or less.

3. The copper powder according to claim 2, having a total content of sodium, sulfur, and chlorine of 0.10 mass % or less.

4. The copper powder according to claim 2, having a sintering onset temperature of 170° to 240° C.

5. The copper powder according to claim 1, having a total content of sodium, sulfur, and chlorine of 0.10 mass % or less.

6. The copper powder according to claim 5, having a sintering onset temperature of 170° to 240° C.

7. The copper powder according to claim 1, having a sintering onset temperature of 170° to 240° C.

* * * * *